United States Patent [19]

Newland

[11] Patent Number: 5,039,826
[45] Date of Patent: Aug. 13, 1991

[54] SEAL FOR SHIELDING ENCLOSURE

[76] Inventor: James F. Newland, 20520 Romar La., Saugus, Calif. 91350

[21] Appl. No.: 431,754

[22] Filed: Nov. 6, 1989

[51] Int. Cl.⁵ .......................... H05K 9/00; E06B 7/16
[52] U.S. Cl. .................................... 174/35 R; 49/478; 361/424
[58] Field of Search ... 174/35 R, 35 GC, 35 MS File; 219/10.55 R, 10.55 D; 361/424; 49/478, 475

[56] References Cited

U.S. PATENT DOCUMENTS

| | | | |
|---|---|---|---|
| 3,260,788 | 7/1966 | Stetson | 174/35 GC |
| 4,110,552 | 8/1978 | Lombardi | 174/35 MS File |
| 4,590,710 | 5/1986 | Newland | 49/478 |

Primary Examiner—Leo P. Picard
Assistant Examiner—Bot L. Ledynh
Attorney, Agent, or Firm—Frank L. Zugelter

[57] ABSTRACT

A seal (35) for a shielding enclosure (20) having a hinged door assembly (27), comprising a non-punctured flexible interior door skin (39) having an outer face (53) mating with a pair of spaced metal bands (74, 75) secured to an edge 91 of a panel 24 which forms the enclosure (20). Columns (79) of magnetic material mount on the exterior faces of such bands (74, 75) and an insulated electromagnetic coil (76) is contained within a cavity formed by the bands' spacing. Energization of coil (76) seals together skin (53) and bands (74, 75). The coil's wiring (84) passes through a sealing conduit (85) in panel (24) to a housing (87) for an electronic control unit inside enclosure (20) that filters out r-f waves traveling through conduit (85). Ingress and egress hand-actuated mechanisms (51, 52) do not interfere with the effected compressible seal, by reason of a special hinge leaf construction. Upon actuation of mechanisms (51, 52), the electromagnetic coil's circuit deenergizes, and the swinging of door assembly (27) upon its hinges (58, 59) is free of magnetic forces.

13 Claims, 6 Drawing Sheets

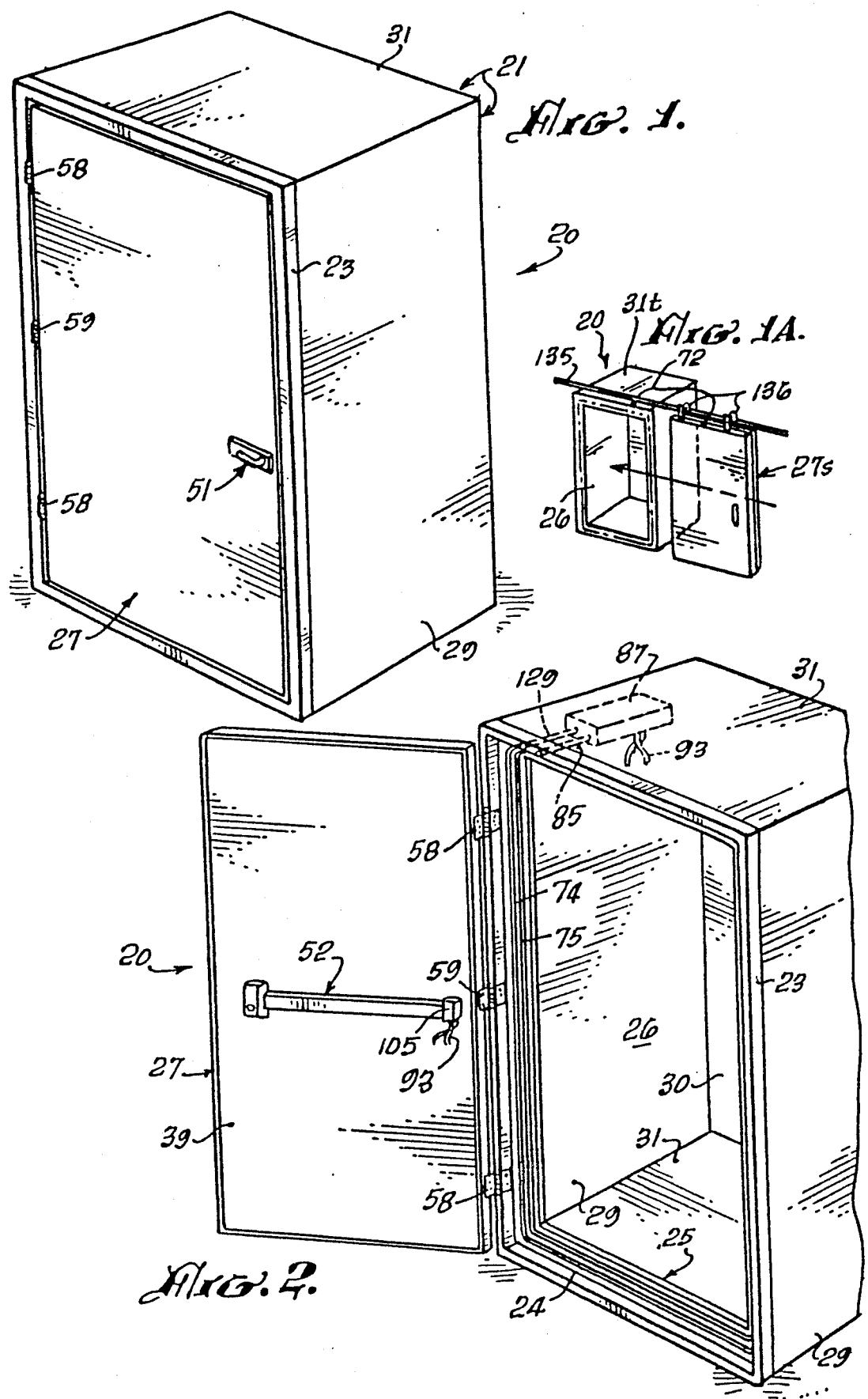

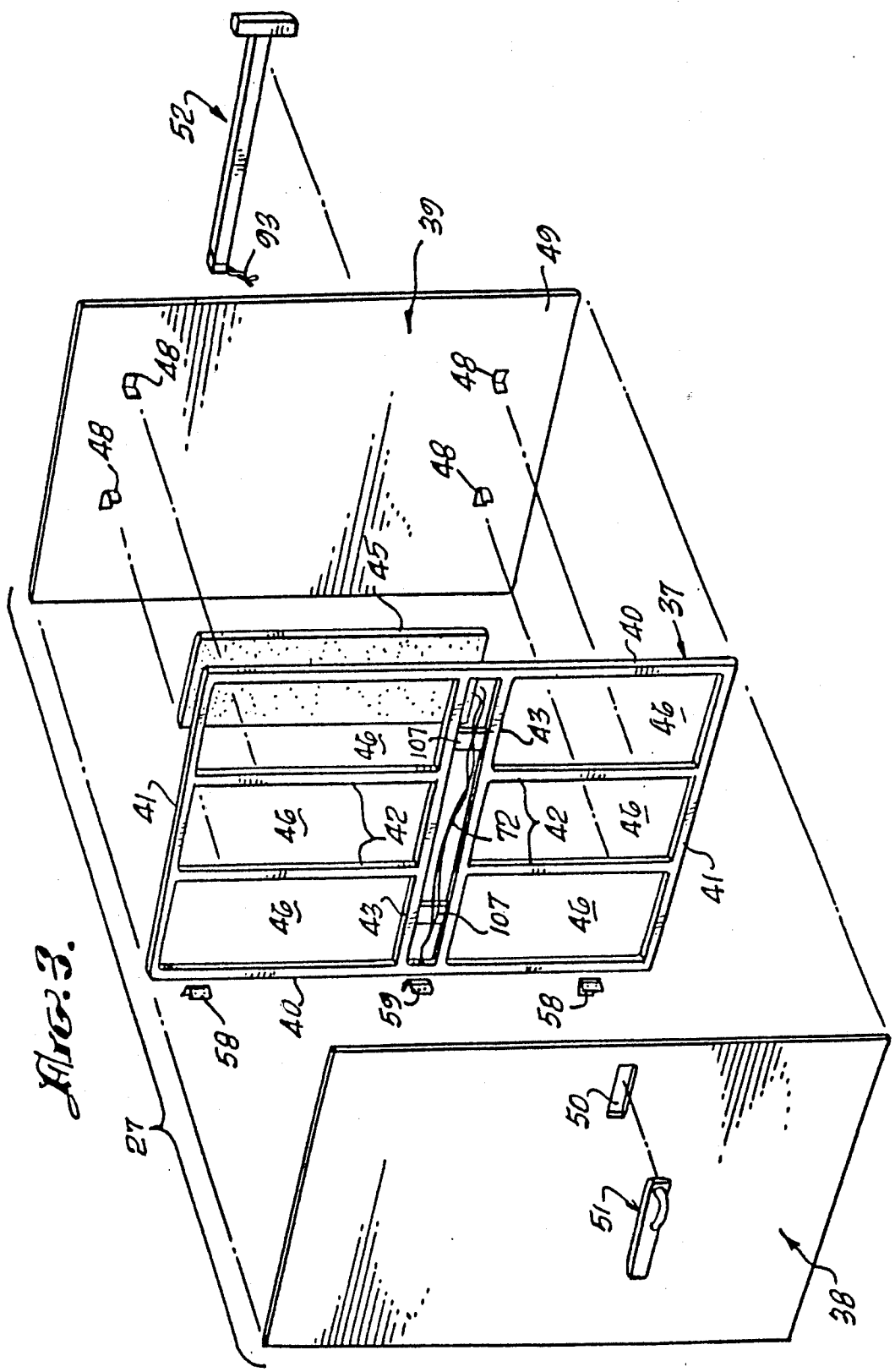

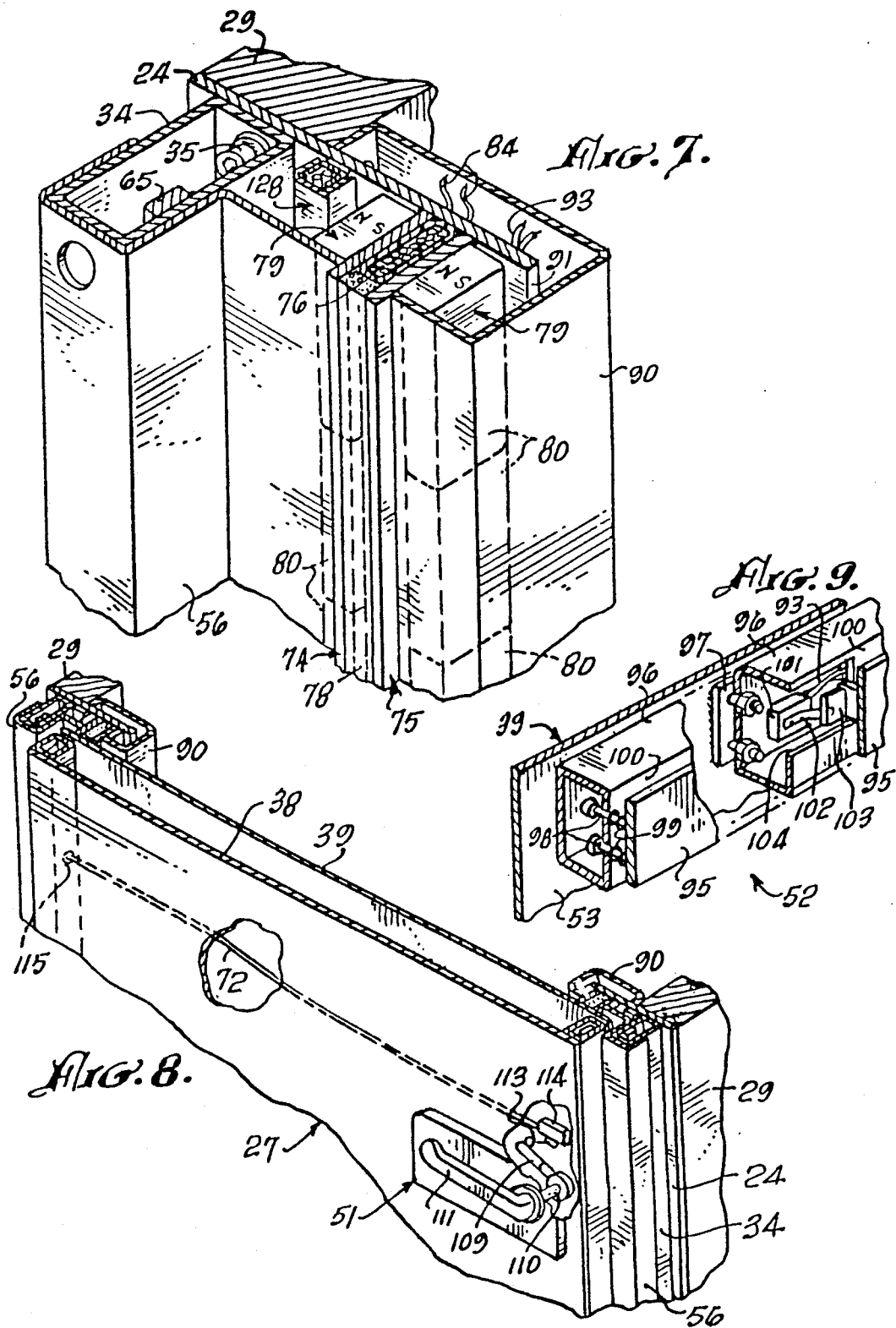

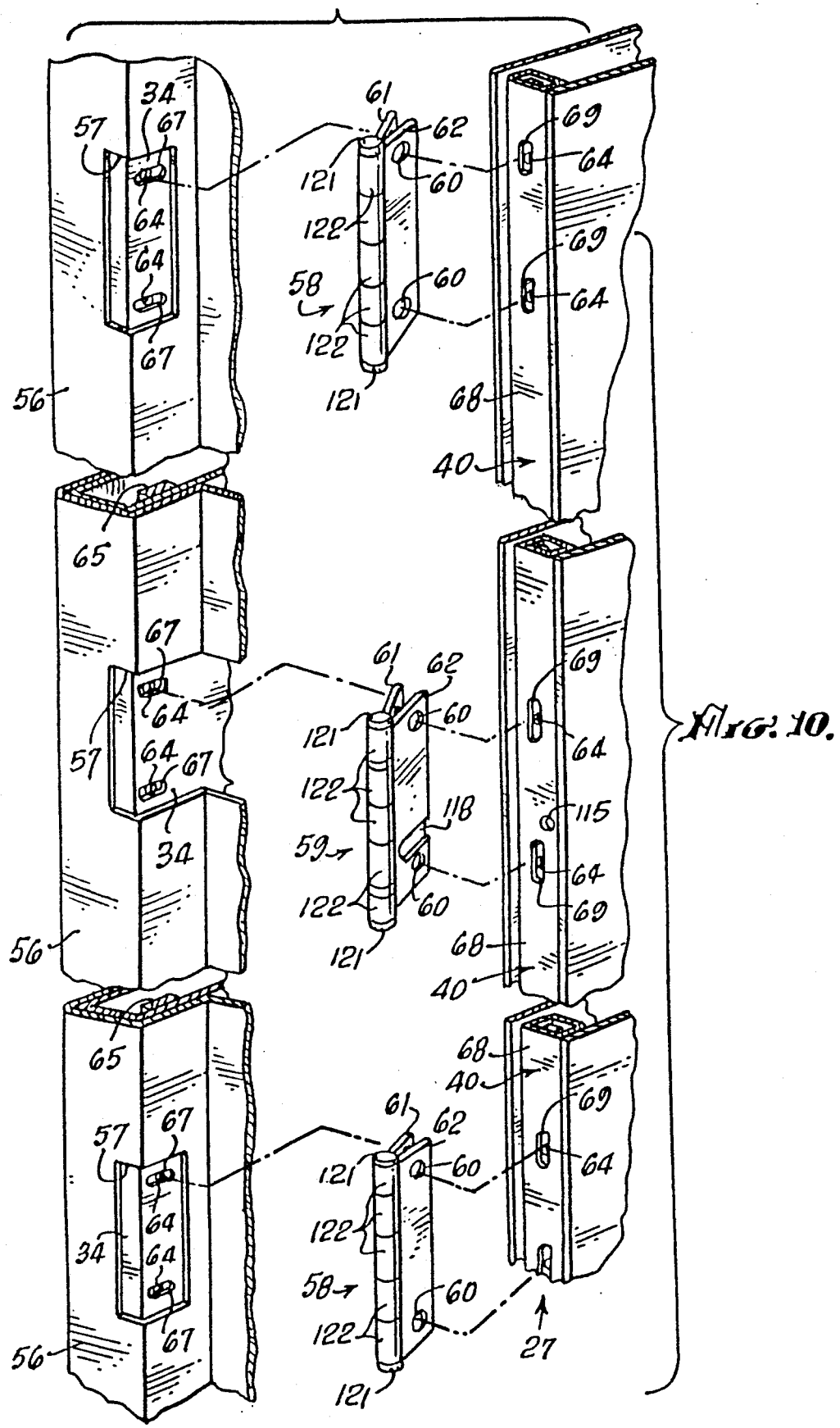

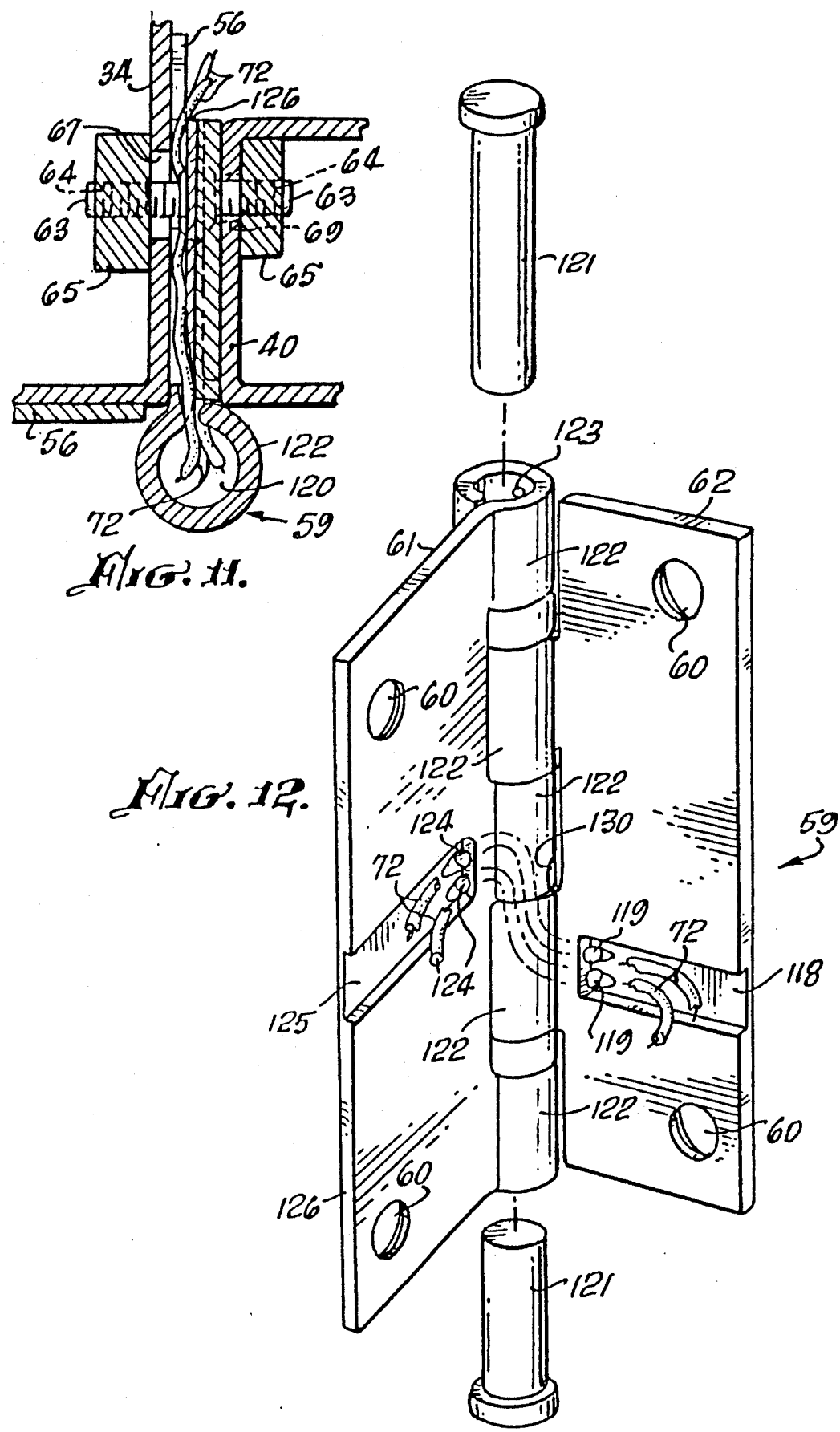

SEAL FOR SHIELDING ENCLOSURE

TECHNICAL FIELD

This invention relates to enclosures utilized to shield radio-frequency (RF) radiation to and from its compartment, and in particular relates to an efficacious seal across its door panel.

BACKGROUND OF THE INVENTION

A. Its Field.

Shielding enclosures are utilized for anechoic chambers, communication facilities, mobile communications, computer facilities, test units, securement-of-conference-room communications, clean rooms, and the prevention or regulation of electrical and other signals in the atmosphere or space. An opening or door entryway is needed in or through each enclosure for ingress and egress hereinafter 'access') by personnel to and from the enclosure's compartment or into or from a closed enclave continuously attached to such a compartment. Thus, an efficacious sealing mode between the enclosure's wall panel and the door across its entryway or opening must be achieved in order to prevent leakage of any radio-frequency or electro-magnetic radiation out of or into the enclosure. In constructing and assembling these systems, each is built to a particular specification by the user for a given range or ranges of signals, as in reality heretofore, leakage has occurred. Thus heretofore, the specification was drawn to meet a maximum of leakage allowed in a particular constructed system. The performance of meeting such leakage maximum was measured by the attenuation of a loss of leakage for a given constructed or built enclosure or system.

B. Problems in the Prior Art.

A major problem facing the shielding enclosure industry is the lack of solving a frequency-wave penetration through a door assembly mounted across the opening or entry (exit) way to the enclosure's compartment. Perforations, holes, openings somewhere in or about the door assembly were present as a result of the requirement for operating elements to open and/or close the door whereby personnel could gain access in either direction. Thus, these deficiencies would serve as bases for conduits through which leakage of radio-frequency waves would occur, by their passage or radiation either way. Present state-of-the-art enclosures include construction and/or design which attenuate such leakage of radio frequency (R-F) waves to various degrees, but never eliminating the leakage. This invention substantially eleminates the problem of leakage.

C. Description of the Prior Art.

See my U.S. Pat. No. 4,590,710, granted May 27, 1986, together with identification of prior art teachings set forth in the specification and Abstract of that patent.

SUMMARY OF THE INVENTION

The invention is directed to a non-penetratable seal generated between a door assembly and its door frame or compartment so that leakage of radio-frequency (RF) wave lengths does not occur in either direction, to or from the shielding enclosure's compartment. The door assembly includes an interior door skin with which an endless band or bands extending from an enclosure's wall panel or door frame engage or abut. This particular wall panel or door frame element includes a walk-through doorway for ingress to and egress from the compartment, and such band-engagement of panel to skin is an endless loop-like contact circumscribing the entryway or opening formed in such panel or door frame element. In the pocket between the endless bands, an electromagnetic coil is disposed, while columns of magnetic material are mounted exteriorly of and around the endless bands. Upon energization of the electromagnetic coil, which is part of an electromagnetic circuit, a compressive force is exerted such that the door's skin tightly compresses upon the edges of such bands, to effect a non-penetrable seal, and thus a seal completely around or about the doorway. The wiring from the electromagnet coil passes through a first hole in the wall panel or door frame element circumferentially disposed about the entryway, however, a conduit for such wiring is sealed, such as by welding or brazing, to such hole, and directs or leads the wiring to an electronic control unit mounted within the compartment and by which an r-f wave travelling through such conduit is effectively filtered out.

Ingress and egress (personnel) actuating mechanisms are mounted on both sides of the door assembly. These mechanisms in their actuations de-energize the electromagnetic circuit and coil, and thereby facillitate the opening of the door assembly from its sealed closure mode. The wiring of the exteriorly mounted one of these mechanisms, to gain ingress to the compartment, passes through a specially constructed hinge of the door assembly to the door frame, the hinging being disposed outside of the shield or effected seal area, and through a second hole in the wall panel or door frame element circumferentially disposed about the entryway, again, entering a conduit or tubing sealed to that hole and through which such wiring is directed or led to the electronic control unit which effectively filters out radio-frequency waves that may have entered through the second hole. The wiring of the interiorly mounted actuating mechanism to gain egress, lies within the shield already, and is conveniently directed to the filtering electronic control unit mounted elsewhere in the compartment. Trim members are provided for the door frame and frontal plate, functioning as a plenum chamber conducting away generated heat from the electromagnetic coils and as a raceway for the wirings of the interiorly mounted actuating mechanism.

An object of this invention is to provide a seal across a door skin which itself is flexible, vis-a-vis a flexible door frame construction long used in shielding enclosures.

An object of this invention is to provide a novel shielding enclosure.

Another object of this invention is to effacaciously eliminate leakage of RF waves to or from the compartment of a shielding enclosure.

A further object of the invention is to provide personnel actuating mechanisms for effecting release of the enclosure's seal, from either in the compartment or exteriorly of the enclosure, and thus provide for opening of the door assembly from the compartment.

Another object of the invention is to provide a construction of a shielding enclosure that facillitates servicing of the shielding enclosure in the event repair or replacement of its components are necessary.

These and other objects and advantages will become more apparent upon a full and complete reading of the following description, the appended claims thereto, and the accompanying drawing comprising six (6) sheets of twelve (12) FIGURES.

BRIEF DESCRIPTION OF THE DRAWING

FIG. 1 is a perspective view of a closed shielding enclosure embodying the invention.

FIG. 1A is a perspective view of a modified shielding enclosure embodying the invention.

FIG. 2 is a perspective view of the enclosure of FIG. 1 but with its door assembly in open mode.

FIG. 3 is an exploded perspective view of the door assembly, and also showing personnel actuating mechanisms that are mountable to opposite sides of the door assembly.

FIG. 7 is a fragmentary perspective view of endless elements or components of the invention by which seal is effected.

FIG. 8 is a fragmentary perspective view, partly cutaway, from exterior of the door assembly in its closed mode to the door frame and shielding enclosure, showing one personnel actuating mechanism.

FIG. 9 is a fragmentary perspective view, partly cutaway, from interior of the door assembly, showing the interiorly mounted personnel actuating mechanism.

FIG. 10 is an exploded perspective view of an arrangement among assembly, door frame and hinge members showing their hinging construction and a special one through which electrical wiring from the exteriorly mounted personnel actuating mechanism travels from the door assembly through the special hinge to the door frame.

FIG. 11 is a cross-sectional view of the specially constructed hinge for passage of wiring from the exteriorly mounted personnel actuating mechanism on the door assembly to the door frame and shielding enclosure.

FIG. 12 is a perspective detailed view of the hinge shown in FIG. 11.

BEST MODE(S) FOR CARRYING OUT THE INVENTION

Figure 4:
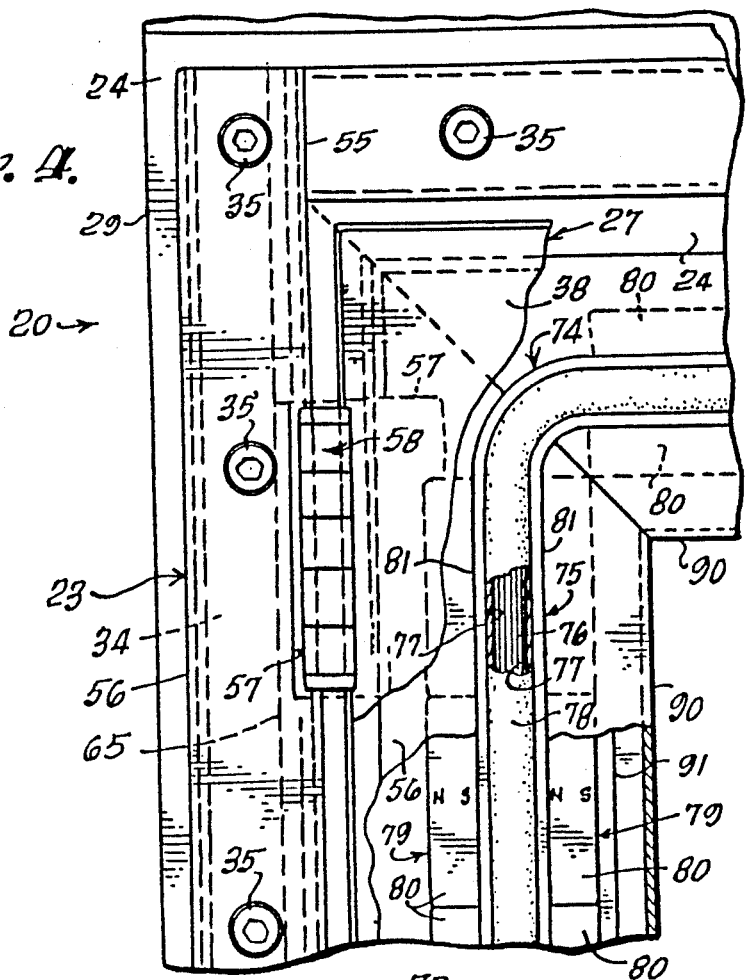
FIG. 4 is a fragmentary elevational view, partly cutaway, of a corner of door frame and door assembly.

Referring now to the drawing wherein reference characters therein correspond to like numerals hereinafter, FIGS. 1, 2, 4 illustrate a shielding enclosure 20 comprising a plurality 21 of wall panels—side, rear, top and bottom joined together, a door frame 23 secured to a frontal panel 24 (which could or may be considered part of the door frame, but for purposes of description of this disclosure, it will be referred to as a frontal panel) having an opening 25 formed therein and constituting an entry or exit way for personnel to and from a compartment 26 formed by such panel plurality 21, and a door assembly 27 mounted to door frame 23. The panel plurality 21 comprises metallic side panels 29, rear panel 30, top and bottom panels 31, all of which are suitably joined together such as by continuously welded seams to form the non-perforated compartment 26 in enclosure 20. Frontal panel 24 is welded to the corresponding front edges 32 (one of which being shown in FIG. 5) of all the other panels except those of rear panel 30. Door frame 23 comprises rigid tubular members 34 bolted, as at 35, to frontal panel 24, thus providing a firm support for door assembly 27.

Door assembly 27, FIG. 3, comprises an aluminum tubular frame 37 on which door skins 38, 39 mount. Frame 37 includes vertically-oriented members 40 joined together with top and bottom horizontally-oriented members 41, to form the basis of the assembly's outwardly appearing configuration. Interiorly-disposed spaced members 42 are joined at their outer ends to members 41 and joined at their inner ends to corresponding cross-members 43 spaced from one another, the outer ends of cross-members 43 being joined to members 40. All of these tubular members are joined together by suitable known welding processes. Sound absorbing material 45 preferably is mounted in the spatial sections 46 resulting from the fabrication of frame 37. Exterior skin 38 is suitably riveted to the one side of frame 37 while L-shaped brackets 48 welded to the inner side 49 of interior skin 39 are secured by fasteners, such as rivets, FIG. 3, to spaced members 42. An aperture 50 is cut out of exterior skin 38 for disposition of elements of a handle mechanism 51 which when actuated deenergizes an electromagnetic circuit, hereinafter more fully described, in one operation of the invention. It may be noted here that no puncture, perforation, hole, or other penetration exists in interior skin 39, although an exit or panic actuating mechanism 52 is mounted on its outer side 53 (FIG. 5), also more fully described hereinafter.

Figure 5:
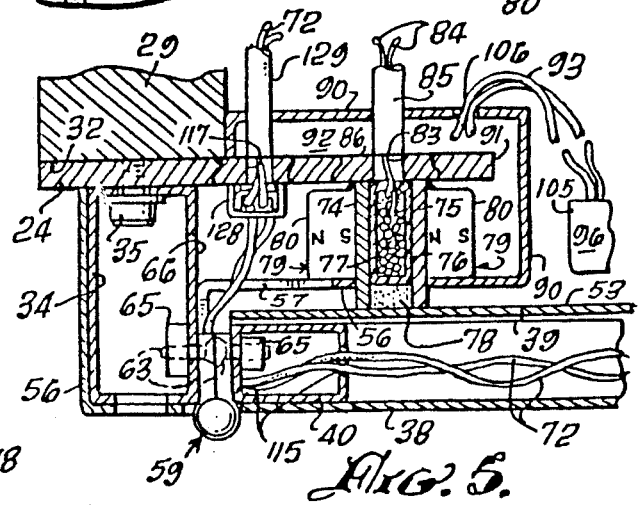
FIG. 5 is a cross-sectional view midway of door frame, door assembly, and a specially constructed hinge, by which passage of wiring from an exteriorly mounted actuating mechanism is transferred to wall or door frame element.

Door frame 23, FIGS. 4, 5, 7, comprises rigid tubular members 34 the ends of which abut one another, as at mating line 55, FIG. 4, in their assembly to frontal plate 24. Mating line 55 in FIG. 4 is illustrative of all such abutments, so that frame 23 forms a configuration or outline that generally corresponds to that of door assembly 27, in this instance, rectangularly-shaped and having four (4) corners at which mating line 55 is located. As already described, tubular members 34 are secured to frontal panel 24 by means of a plurality of bolts 35 spacedly positioned along their lengths and threaded into such panel 24. A trim member 56 is mounted about tubular frame members 34 and one of them includes notched-out recesses 57, FIG. 10, at the location of hinges 58, 59, FIGS. 10, 3 which mount door assembly 27 to one of such tubular members 34. Trim members 56 are of sheet or other suitable metal and extend around and are mounted to tubular members 34, such mounting of one being illustrated in FIG. 5, and are configured as shown by conventional "brake" apparatus which bends them into their desired configurations for fitting to tubular members 34.

Door assembly 27 is mounted to one of the vertically-oriented tubular members 34, FIGS. 4, 5, 10, by means of a plurality of the spaced hinges 58, 59. The top and bottom hinges 58 are of conventional heavy-duty type, including counter-sunk apertures 60 in each of its leaves 61, 62 for screws 63, FIG. 5, which are threaded to tapped holes 64 formed in metal strips or bars 65 which float within the vertically-oriented tubular members 34 and 40, of the frame and door assemblies, respectively. The facing wall 66 of tubular member 34 includes laterally-extending slots 67 aligned with apertures 60 of leaf 61 and tapped holes 64 in a strip 65 to which screws 63 are fastened. In regard to the proximate or facing wall 68 of tubular member 40 in door assembly 27, screws 63, FIG. 5, in counter-sunk holes 60 of leaf 62 extend through vertically extending slots 69 of another floating metal strip or bar 65. Thus, door assembly 27 can be adjusted vertically and horizontally in its position for a proper clearance fit to the door frame's tubular members in a given enclosure construction.

The middle hinge 59 is provided with a special construction enabling the passage of wiring 72, FIGS. 8, 5, 3, to extend from actuating mechanism 51 to frontal plate 24, and is more fully described hereinafter.

A pair of endless spaced metal bands 74, 75, FIGS. 4, 5, 7 is securely mounted, such as by welding, to frontal plate 24. The bands extend forwardly to abut or engage the outer side 53 of interior skin 39 of door assembly 27 while also circumscribing the entryway or opening 25 formed in frontal plate 24 for personnel access. An electromagnetic coil(s) 76, part of an electromagnetic circuit, is mounted or seated in the cavity formed by the spaced bands 74, 75 and frontal plate 24, the coil being contained within a fold of plastic material 77 to prevent grounding of the coil against metal. Coil 76 and plastic material 77 are secured in such cavity by a suitable potting compound 78. A column 79 of magnetic material, here in the form of ceramic magnetic blocks 80 sequentially mounted one to the next, is mounted to or around the endless exterior faces 81, FIGS. 4, 7 of bands 74, 75, held in position by the attraction of their magnetic characteristics to the metallic nature of the bands, with a proper orientation of their north (N) and south (S) poles in relation to such bands as shown in FIG. 5. A hole 83 is provided in frontal plate 24 for passage of the electromagnetic coil's wiring 84 into the physical extent of compartment 26, however, it is to be noted that such wiring 84 is retained within a tubing or conduit 85 welded or brazed to and about such hole 83 on the interior face 86 of frontal panel 24, the conduit 85 extending to an electronic circuitry control unit within a housing 87, FIG. 2, welded to the interior ceiling of compartment 26. Thus, any r-f wave along wiring 84 but within conduit 85 is filtered out, i.e., eliminated by a filtering circuit in such control unit, and does not otherwise enter the physical extent of compartment 26. It should be noted that such circuitry or control unit 87 is not part of the invention, however, state-of-the-art circuitry is available to so filter out such wavelengths and need not be further described herein.

A trim member 90, FIG. 5, is mounted around the edge 91 of frontal panel 24 that forms the opening or entryway 25. As illustrated in FIGS. 5, 7, trim 90 extends throughout or along the peripheral contour of edge 91, and is held in its position by its configuration and the magnetic attraction with blocks 80 on bands 74, 75. It forms a plenum chamber 92 which conducts away heat generated by the electromagnetic circuitry and also functions as a carrier channel or raceway for wiring 93 from actuating mechanism 52 towards the electronic control unit in housing 87.

Actuating mechanisms 51, 52, FIGS. 3, 8, 9, are provided to de-energize the electromagnetic circuit containing coil 76, so that the opening by personnel of door assembly 27 is facilitated after or when such circuit is de-energized. Exit actuating mechanism 52 comprises, FIGS. 9, 3, a push bar 95 spring-biased away from a tubular member 96 securely mounted to a plate 97 welded to outer side 53 of interior door skin 39. Push bar 95 is mounted on short stems 98 about which coiled springs 99 are mounted, the stems 98 being mounted through a facing wall 100 of tubular member 96, so that push bar 95 is maintained or biased away from wall 100. A micro-switch 101 having a spring lever 102 is secured within tubular member 96 for operative action with a flanged tab 103 disposed within a small opening 104 in tubular member 96 and which depends from push bar 95. Wiring 93 extends from micro-switch 101, through tubular member 96 to its one end 105, FIGS. 2, 5, from which it egresses, its path continuing to and behind trim 90, within compartment 26, where through a punched hole 106 in trim 90, FIG. 5, it enters chamber 92 which functions as the wiring's raceway by which it continues towards housing 87, FIG. 2. There it is operatively connected to the circuit controlling current to the electromagnetic coil 76. It is to be noted that this mechanism 52 and its wiring 93 are never without or exterior to the seal between bands and the interior door skin, as they lie within the physical extent of compartment 26 when door assembly 27 is in its closed mode. It may be noted further that support bars 107, FIG. 3, are secured to, and within the space provided by, cross-members 43, at locations corresponding to the pressure points applied to pushbar 95 and tubular member 96 by personnel operating mechanism 52, to prevent deformity of flexible skin 39 at those points by the repetitious use of push bar 95.

Figure 6:
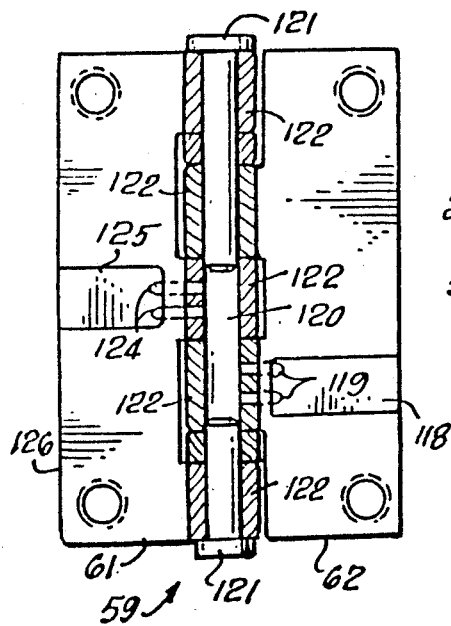
FIG. 6 is a full view in open mode of the specially constructed hinge.

With regard to actuating mechanism 51, FIGS. 8, 3, its handle unit is suitably mounted to the outer side of exterior skin 38. A lever 109 is attached at the inner end of a shaft 110 for a handle 111 in the unit. Shaft 110 cooperates with a spring lever 113 of a micro-switch 114 that is included and mounted within the unit. Wiring 72 extends from micro-switch 114 along the space between cross-members 43, passing through holes 115, FIGS. 5, 8, in the one aluminum tubular member 40, and thereafter entering special hinge 59, FIG. 5, to exit therefrom for further passage to the second hole 117 located at a convenient point in frontal plate 24. In hinge 59, FIGS. 6, 11, 12, a first slot 118 is cut within the thickness of the hinge's leaf 62, on its leaf side which faces the one tubular member 40 in accordance with the earlier described face mountings for hinges 58. The path of wiring 72 extends into such slot 118 and enters, through one or more holes 119, a chamber 120, FIG. 11, formed by shortened hinge pins 121 and the curled portions 122 of leaves 61, 62, with pins pins being secured by set screws 123, FIG. 12, through the curled portions. The path of wiring 72 continues, then, to another level within such chamber 120, for exiting therefrom, via one or more holes 124 in leaf 61, into another slot 125 formed in the thickness of leaf 61, slot 125 facing rigid tubular member 34 of door frame 23. Wiring 72 does not enter member 34 but rather its path travels in hinge slot 125 to the longitudinal edge 126 FIGS. 11, 6, of leaf 61, where its path then is directed out of one of the notches 57, FIGS. 5, 10, cut in trim 56 about leaves 61, here, about the middle hinge 59, to a point along frontal plate 24, to be retained at that point within channel members 128, one of which being adhesively mounted to frontal plate 24 while the other functions as a cover or lid for the wiring. The path of wiring 72 then continues in a direction, via channel members 128, to the second hole 117 in such plate 24. Wiring 72 passes through hole 117 to enter a conduit or tubing 129 welded to its other side, and thereafter its path is directed to housing 87, FIG. 2, and into the control unit therein that operates upon the elctromagnetic circuitry containing coil 76. In no way does the actuation of handle mechanism 51 penetrate the seal effected for shielding enclosure 20 nor provide otherwise for leakage of r-f wavelengths.

In operation of the invention, as long as door assembly 27 is in closed mode, current is supplied in the electromagnetic circuit containing coil 76. Thus, flexible door skin 39 is compressed tightly against bands 74, 75, to effect substantially a complete seal across doorway 25, the columns of magnetic material 79 enhancing or adding to the magnetic forces created by the electromagnetic coil 76 to cause such seal. Upon either turning handle 111 or depressing push bar 95, in their respective actuating mechanisms 51, 52, the corresponding microswitch 114, 101 is actuated, their respective wirings 72, 93 signalling the control unit to open the circuit in wiring 84 to the electromagnetic coil 76. Door assembly 27 now can be opened by a push or a pull.

In an assembly of shielding enclosure 20, although not limited to or necessarily in order of the following description or of that provided above, the plurality 21 of wall panels are assembled together and sealed to form compartment 26. Frontal panel 24 with its opening 25 is fabricated from flat metal members welded to one another, after which bands 74, 75 are welded thereto. A fold or envelope of plastic material insulation 77 is seated in the cavity formed by such bands and electromagnetic coil 76 then generated therein, its wiring ends made to pass through hole 83, FIG. 5. Potting compound 78 is applied and then this assembly is welded to edges 32. Metal tubular couplings (not shown) usually are first welded to the backside of panel 24 and about holes 117, 83, to facilitate later the assembly of conduits 129, 85 and the wiring 72, 84 which thread therethrough. Tubular members 34 may be welded together first, or first each applied to frontal plate 24 by bolts 35. Door assembly 27, FIG. 3, is assembled separately by framing frame 37 upon skin 39 and welding them together via L-shaped brackets 48, after which fashioned sound absorbing material blocks 45 are mounted in spatial sections 46. Wiring 72 is strung across the space between cross-members 43, one end threaded through the one tubular member 40 while the other end is projected through aperture 50 of skin 38 which then is riveted to frame 37. During the mounting of leaves 61 to tubular member 40, with the assistance of tapped holes 64 in strips 65 and hinge screws 63, wiring 72 is threaded through hinge 59, with the aid of a working hole 130, FIG. 12, communicating with chamber 120. Door assembly 27 then is hingedly mounted to door frame 23, again with the assistance of elements 63, 64, 65. Slots 67, 69 provide for door height and width adjustments. Magnetic blocks 80 are positioned about bands 74, 75. Actuating mechanisms 51, 52 are made secure in their respective positions on door skins 38, 39 with a hook-up thereto of their respective wirings 72, 93. Wiring 72 at tubular member 40 is seated in one of the channel members 128 after which its lid is applied, the wiring 72 then passed through hole 117 and into and through tubing 129. Trim 90 is mounted, with hole 106 punched therein for passage of wiring 93 the path of which then being directed to housing 87 for hook-up to the control unit, as also for wiring 72 and for wiring 84 which has been threaded through tubing 85. Trim 56 is mounted in place.

FIG. 1A illustrates another embodiment of the invention wherein a sliding door assembly 27s is mounted on a rail 135 by means of which wheels 136 guide or move the assembly to and from a frontal position to the enclosure 20 and its compartment 26. The wiring 72 from mechanism 51 egresses from a top tubular member in the door frame its path being directed to a "frontal panel", like 24, which here is disposed horizontally of the enclosure, for example, the top panel 31t itself. Or the "frontal panel" may be vertically oriented as well. The wiring 72 again passes through a hole, such as like hole 117, in the frontal panel, it then being threaded through a tubing such as 129, for subsequent operative connection to the circuit in an electronic control unit in housing 87 which controls current to the elctromagnetic coil 76. Operation is the same as described above, bands 74, 75 compressing the interior door skin to themselves to obtain the seal, while substantially no leakage occurs. A sufficiently long flexible conduit carrying wire 93 from mechanism 52 to trim member 90 (not shown in FIG. 1A) is readily adaptable to this embodiment.

It now should be apparent that the invention provides for the substantial elimination of leakage of r-f wavelengths in a shielding enclosure. Flexibility of movement in three-dimensions in door skin 39 provided by its mounting to door frame 37 provides for a complete physical engagement with bands 74, 75, without any pocket of non-engagement developing as the current-filled coil 76 produces or creates a magnetic field which draws flexible skin 39 into physical contact with bands 74, 75. These bands are an integral part of the r-f shielding compartment 26, thus such contact forms a perfect integral continuous seal to steel under compression, which is necessary for proper shielding performance. The column or columns of magnetic material enhances the strength of the coil to provide additional compressive forces. Only to the extent of reaching the electronic control unit in housing 87 does any wavelength gain access to or egress from the physical extent of compartment 26, and then, to be filtered out, thus, in effect denying entry into or from such compartment of the wavelength(s).

Not only is superior performance realized in the operation of the invention, its capability to maintain such performance is extended over a longer period of time than that for present state-of-the-art enclosures, and virtually eliminates maintenance. Also, heat generated by coil energization and its functioning is readily dissipated via the plenum chamber formed by trim 90.

Suitable materials are available for the enclosure. Steel is used for most of the major components of the enclosure, although tubular members 40 and skin 38 may be of aluminum for decreasing the weight of the entire structure. Magnetic blocks 80 are of known ceramic nature, and their proper N-pole and S-pole orientation upon bands 74, 75 provide for compatability with the coil winding. The coil itself includes insulation and is of the type used in electromagnetic circuitry applications. Formica or aluminum-faced Styrofoam constitutes materials 45. Actuating mechanisms 51, 52 are known alarm-exit products available in the marketplace.

INDUSTRIAL APPLICABILITY

The invention has applicability to industries which are reflected above in the description pertaining to the Field of the invention, and to other useful areas of application.

I claim:

1. In a shielding enclosure including wall panels forming a compartment and a door assembly having an exterior skin and being mounted about one of said wall panels which also includes an access opening to and from the compartment and through which opening it is sought to eliminate leakage of radio-frequency wavelengths by a seal across such opening while the enclosure is in a closed mode, the improvement comprising a flexible interior door skin having an outer face included in the door assembly and a means including an electromagnetic circuit attached to said one of said wall panels about such access opening for engaging said outer face of said flexible interior door skin, thereby providing the seal between said engaging means and flexible interior door skin upon energization of the electromagnetic circuit, said engaging means comprising an endless metal band and an electromagnetic coil mounted on said band.

2. The improvement of claim 1 including a column of magnetic material mounted about said band.

3. The improvement of claim 1 wherein
said engaging means comprises
a pair of spaced bands forming a cavity and having exterior faces, and
an electromagnetic coil mounted in the cavity.

4. The improvement of claim 3 including
a column of magnetic material mounted about each of said exterior faces of said bands.

5. The improvement of claim 1 or claim 2 or claim 3 or claim 4 including
a first hole in said one of said wall panels, and
a first tubing connected to said first hole for providing a sealed-off path by which connection of said coil is adapted to be extended to an electronic filtering control unit in the compartment and therein be operatively connected to the circuit that de-energizes it.

6. The improvement of claim 5 including
first means for actuating a circuit de-energizing the electromagnetic coil, said first means mounted on said outer face without penetrating said flexible interior door skin.

7. The improvement of claim 6 including
second means for actuating a circuit de-energizing the electromagnetic coil, said second means mounted on said exterior skin.

8. The improvement of claim 7 wherein
said second means comprises
a handle mechanism including wiring adapted to enter the compartment in a sealed-off manner from the physical extent of the compartment for operative connection in the control unit to the circuit that de-energizes the coil,
hinge means including a path for said wiring to said one of said wall panels,
a second hole in said one of said wall panels, and
a second tubing connected to said second hole to provide a continuing sealed-off path for said wiring to the control unit.

9. The improvement of claim 8 wherein
said hinge means comprises
first and second leaves and hinge pins,
a slot in each of said leaves, and
a chamber formed between said hinge pins forming the path for said wiring from one slot to the other,
such path of said wiring extending from the slot in the second of said leaves to said second hole.

10. The improvement of claim 1 or claim 2 or claim 3 or claim 4 including
first means for actuating a circuit de-energizing the electromagnetic coil, said first means mounted on said outer face without penetrating said flexible interior door skin.

11. The improvement of claim 10 including
second means for actuating a circuit de-energizing the electromagnetic coil, said second means mounted on said exterior skin.

12. The improvement of claim 11 wherein
said second means comprises
a handle mechanism including wiring adapted to enter the compartment in a sealed-off manner from the physical extent of the compartment for operative connection in the control unit to the circuit that de-energizes the coil,
hinge means including a path for said wiring to said one of said wall panels,
a second hole in said one of said wall panels, and
a second tubing connected to said second hole to provide a continuing sealed-off path for said wiring to the control unit.

13. The improvement of claim 12 wherein
said hinge means comprises
first and second leaves and hinge pins,
a slot in each of said leaves, and
a chamber formed between said hinge pins providing a path for said wiring from one slot to the other,
the path of said wiring extending from the slot in the second of said leaves to said second hole.

* * * * *